(12) United States Patent
Koyama

(10) Patent No.: US 11,258,156 B2
(45) Date of Patent: Feb. 22, 2022

(54) ELEMENT USED FOR AN OSCILLATION OR DETECTION OF A TERAHERTZ WAVE

(71) Applicant: CANON KABUSHIKI KAISHA, Tokyo (JP)

(72) Inventor: Yasushi Koyama, Kamakura (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/061,325

(22) Filed: Oct. 1, 2020

(65) Prior Publication Data
US 2021/0021013 A1  Jan. 21, 2021

Related U.S. Application Data

(63) Continuation of application No. 16/169,790, filed on Oct. 24, 2018, now Pat. No. 10,833,389, which is a
(Continued)

(30) Foreign Application Priority Data

Apr. 28, 2016 (JP) ............................ JP2016-091581
Apr. 11, 2017 (JP) ............................ JP2017-078410

(51) Int. Cl.
*H01P 7/08* (2006.01)
*H01Q 9/04* (2006.01)
(Continued)

(52) U.S. Cl.
CPC .......... *H01P 7/082* (2013.01); *H01Q 9/0421* (2013.01); *H01Q 9/0442* (2013.01); *H01Q 13/08* (2013.01); *H03B 7/08* (2013.01); *H03B 7/14* (2013.01)

(58) Field of Classification Search
CPC .... H01P 7/082; H01Q 9/0421; H01Q 9/0442; H01Q 13/08; H03B 7/08; H03B 7/14
(Continued)

(56) References Cited

U.S. PATENT DOCUMENTS

2013/0093475 A1  4/2013  Chang
2014/0023163 A1  1/2014  Xu
(Continued)

FOREIGN PATENT DOCUMENTS

CN  102355258 A  2/2012
CN  103501175 A  1/2014
(Continued)

OTHER PUBLICATIONS

Teng Yi-chao et al.; "A high frequency stability and low phase noise optoelectronic oscillator based on electric injection locking of Rb atomic frequency standard;" Journal of Optoelectronics / Laser; vol. 24, No. 12; Dec. 15, 2013; pp. 1-5.
(Continued)

*Primary Examiner* — Robert J Pascal
*Assistant Examiner* — Jorge L Salazar, Jr.
(74) *Attorney, Agent, or Firm* — Canon U.S.A., Inc. IP Division

(57) ABSTRACT

Provided is an element that can reduce a parasitic oscillation. An element used for an oscillation or a detection of a terahertz wave includes a resonance unit 108 including a first conductor 102, a second conductor 105, a dielectric 104 arranged between the first conductor and the second conductor, a first negative resistance element 101a and a second negative resistance element 101b mutually connected in parallel between the first conductor and the second conductor, a bias circuit 120 that supplies a bias voltage to each of the first negative resistance element and the second negative resistance element, and a line 103 that connects the bias circuit to the resonance unit, and the element is configured in a manner that a mutual injection locking in a positive phase between the first negative resistance element and the second negative resistance element is unstable, and a mutual injection locking in a reversed phase between the first
(Continued)

negative resistance element and the second negative resistance element becomes stable.

32 Claims, 8 Drawing Sheets

Related U.S. Application Data continuation of application No. PCT/JP2017/016687, filed on Apr. 27, 2017.

(51) Int. Cl.
*H03B 7/14* (2006.01)
*H03B 7/08* (2006.01)
*H01Q 13/08* (2006.01)

(58) Field of Classification Search
USPC .............. 333/1.1, 213, 219, 220, 221, 235, 333/236–241, 245, 246, 247
See application file for complete search history.

(56) References Cited

U.S. PATENT DOCUMENTS

| 2014/0266477 A1 | 9/2014 | Sekiguchi |
| 2014/0292428 A1 | 10/2014 | Koyama |
| 2016/0373061 A1 | 12/2016 | Sekiguchi |

FOREIGN PATENT DOCUMENTS

| CN | 103684424 A | 3/2014 | |
| JP | 2013123175 A | 6/2013 | |
| WO | WO-2015129910 A2 * | 9/2015 | ............... H03B 7/08 |

OTHER PUBLICATIONS

Bin Lu et al.; "Research on tunable local laser used in ground-to-satellite_coherent_laser_communication;" Sep. 10, 2015; Shanghai Key Laboratory of All Solid-State Laser and Applied Techniques, Shanghai Institute of Optics and Fine Mechanics, Chinese Academy of Sciences, Shanghai 201800, China;; pp. 1-6.

* cited by examiner

ELEMENT USED FOR AN OSCILLATION OR DETECTION OF A TERAHERTZ WAVE

CROSS-REFERENCE TO RELATED APPLICATIONS

This application is a Continuation of U.S. application Ser. No. 16/169,790, filed Oct. 24, 2018; which is a Continuation of International Patent Application No. PCT/JP2017/016687, filed Apr. 27, 2017, which claims the benefit of Japanese Patent Application No. 2016-091581, filed Apr. 28, 2016 and Japanese Patent Application No. 2017-078410, filed Apr. 11, 2017, both of which are hereby incorporated by reference herein in their entirety.

TECHNICAL FIELD

The present invention relates to an element used for an oscillation or a detection of a terahertz wave.

BACKGROUND ART

An oscillator in which an antenna is integrated in a negative resistance element exists as a current injection type light source that generates an electromagnetic wave in a frequency domain from a millimeter wave band to a terahertz band (higher than or equal to 30 GHz and lower than or equal to 30 THz) (hereinafter, which will be referred to as a "terahertz wave"). Specifically, an element that can oscillate the terahertz wave in which a double barrier type resonant tunneling diode (RTD: Resonant Tunneling Diode) corresponding to a negative resistance element and a micro strip antenna are integrated on the same substrate exists.

PTL 1 describes that, in an oscillator in which an antenna is integrated in a plurality of negative resistance elements, the plurality of negative resistance elements are locked in a positive phase or a negative phase with each other to improve an oscillation output of the terahertz wave.

A parasitic oscillation caused by a bias circuit that includes a power source for adjusting a bias voltage of the negative resistance element and a wiring may occur in the element using the negative resistance element in some cases. The parasitic oscillation refers to a parasitic oscillation in a frequency band on a low frequency side different from a desired frequency and decreases an oscillation output at the desired frequency.

PTL 2 describes a configuration in which a distance from the negative resistance element to a shunt resistance constituting a low impedance circuit is set to be higher than ¼ of an equivalent wavelength at a frequency $f_{LC}=\frac{1}{2}\sqrt{\pi LC}$.

It should be noted that an inductance of a strip conductor of a wiring structure is set as L, and a capacitance of the micro strip antenna is set as C in the frequency $f_{LC}$. According to the configuration described in PTL 2, when the inductance L is increased to decrease a resonance frequency $f_{LC}$, a resistive loss at the frequency $f_{LC}$ is increased to decrease the parasitic oscillation caused by a feeding structure.

CITATION LIST

Patent Literature

PTL 1 Japanese Patent Laid-Open No. 2013-168928
PTL 2 Japanese Patent Laid-Open No. 2014-14072

Non Patent Literature

NPL 1 Jpn. J. Appl. Phys., Vol. 47, No. 6, 4375 (2008)
NPL 2 J. Appl. Phys., Vol. 103, 124514 (2008)
NPL 3 J. Infrared Milli Terahz Waves, (2014), 35, p. 425 to 431
NPL 4 IEEE J. Sel. Top. Quantum Electron. 19 (2013) 8500108

According to the configuration of PTL 2, it is possible to reduce the parasitic oscillation in the oscillator using the micro strip antenna such as a patch antenna. However, since this is a configuration in which the low impedance circuit is arranged on an outer side of a strip line, there is a fear that the parasitic oscillation in a relatively high frequency band (higher than 3 GHz) caused by a wiring structure may occur.

In addition, PTL 1 does not describe a method of suppressing the parasitic oscillation caused by the feeding structure or the like.

In view of the above-described problem, the present invention aims at providing an element that can reduce the parasitic oscillation in the high frequency band as compared with a related art.

SUMMARY OF INVENTION

An element as one aspect of the present invention is an element used for an oscillation or a detection of a terahertz wave, the element including a resonance unit including a first conductor, a second conductor, a dielectric arranged between the first conductor and the second conductor, and a first negative resistance element and a second negative resistance element mutually connected in parallel between the first conductor and the second conductor, a bias circuit that supplies a bias voltage to each of the first negative resistance element and the second negative resistance element, and a line that connects the bias circuit to the resonance unit, the element being characterized in that the element is configured in a manner that a mutual injection locking in a positive phase between the first negative resistance element and the second negative resistance element is unstable, and a mutual injection locking in a reversed phase between the first negative resistance element and the second negative resistance element becomes stable.

Further features of the present invention will become apparent from the following description of exemplary embodiments with reference to the attached drawings.

DESCRIPTION OF EMBODIMENTS

Embodiments

An element 100 according to the present embodiment will be described by using FIGS. 1A and 1B.

Figure 1A:
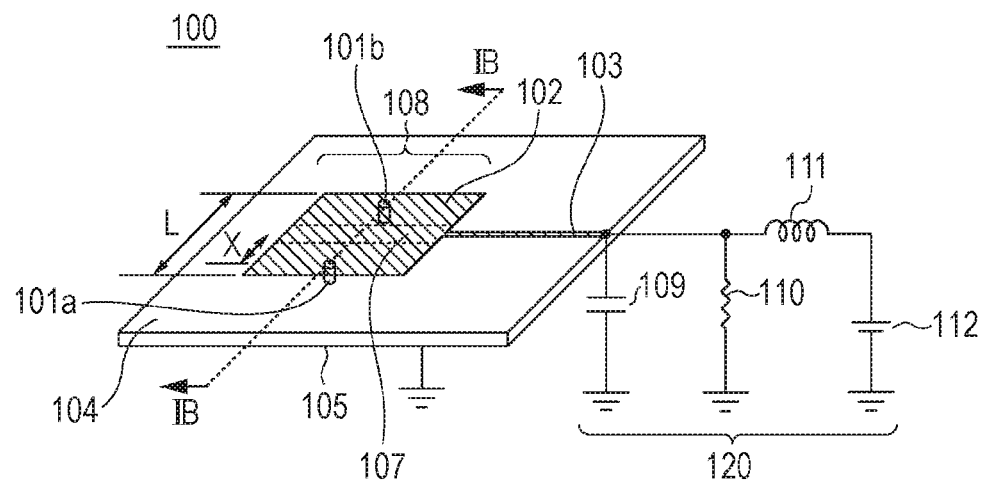
FIGS. 1A and 1B are explanatory diagrams for describing a configuration of an element according to an embodiment.
Figure 1B:
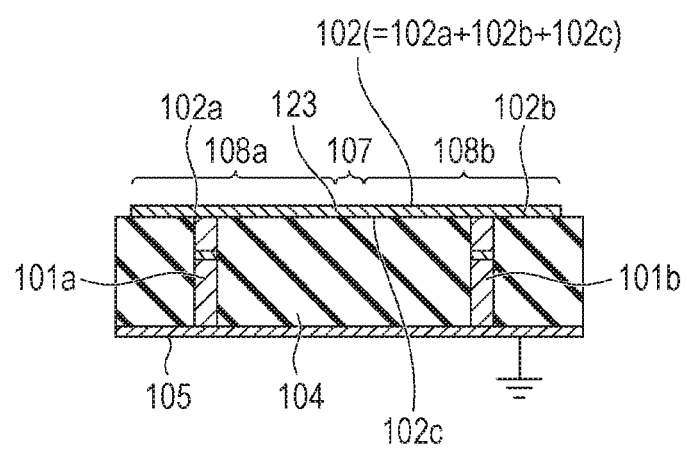

The element 100 is an oscillation element (oscillator) that oscillates an electromagnetic wave at an oscillation frequency $f_{THz}$, FIG. 1A is a perspective view illustrating an external appearance of the element 100 according to the present embodiment, and FIG. 1B is a schematic diagram of an IB-IB cross sectional view thereof.

It should be noted that the element 100 will be hereinafter referred to as an "oscillator 100".

First, a configuration of the oscillator 100 will be described. The oscillator 100 includes a resonance unit (antenna) 108, a line 103, and a bias circuit 120. The antenna 108 includes an upper conductor (first conductor) 102, a second conductor 105, a dielectric 104 arranged between the upper conductor 102 and the second conductor 105, and two negative resistance elements 101a and 101b electrically connected between the upper conductor 102 and the second conductor 105. The second conductor 105 and the dielectric 104 are also arranged in a surrounding area of the antenna 108. One of the two negative resistance elements 101a and 101b is referred to as a first negative resistance element 101a, and the other one is referred to as a second negative resistance element 101b.

A configuration in which the dielectric 104 is sandwiched by the two conductors corresponding to the upper conductor 102 and the second conductor 105 in the antenna 108 is a micro strip resonator using a micro strip line having a finite length or the like. According to the present embodiment, a patch antenna corresponding to one type of the micro strip resonator is used as a resonator of a terahertz wave.

The antenna 108 is an active antenna in which the two negative resistance elements 101a and 101b having an electromagnetic wave gain of the terahertz wave and a resonator in a terahertz waveband are integrated. Each of the first negative resistance element 101a and the second negative resistance element 101b is an element in which an area where a current decreases along with an increase in a voltage, that is, an area having a negative resistance (differential negative resistance area) appears in current-voltage characteristics. The first negative resistance element 101a and the second negative resistance element 101b are electrically mutually in parallel and are electrically connected between the upper conductor 102 and the second conductor 105.

In addition, a gain of the first negative resistance element 101a and a gain of the second negative resistance element 101b are desirably equal to each other.

Herein, "the gains are equal to each other" means that the gain of the first negative resistance element 101a may be in a range of 0.5 folds or higher and 1.5 folds or lower of the gain of the second negative resistance element 101b and is sufficiently accepted in a range of ±10%, for example, corresponding to a standard for a processing accuracy of a semiconductor processing technology.

As the first negative resistance element 101a and the second negative resistance element 101b, specifically, a high frequency element such as an RTD, an Esaki diode, a Gunn diode, or a transistor having one terminal terminated is preferably used.

In addition, a Tunnett diode, an IMPATT diode, a hetero junction bipolar transistor (HBT), a compound semiconductor electronic FET, a high electron mobility transistor (HEMT), or the like may be used.

In addition, a differential negative resistance of a Josephson element using a superconductor may also be used.

According to the present embodiment, a case where a resonant tunneling diode (RTD: Resonant Tunneling Diode) corresponding to a representative differential negative resistance element operating in the terahertz waveband is used as the two negative resistance elements 101a and 101b will be described as an example.

It should be noted that the frequency band of the electromagnetic wave oscillated by the first negative resistance element 101a is preferably overlapped with at least part of the frequency band of the electromagnetic wave oscillated by the second negative resistance element 101b, and more preferably matched.

The antenna 108 is a resonance unit in which the generated electromagnetic wave resonates and has roles as a resonator and a radiator. For the reason, when an effective wavelength of the electromagnetic wave in the dielectric is set as λ, the antenna 108 is set such that a width in an IB-IB direction (resonance direction) of the upper conductor 102 corresponding to a patch conductor of the antenna 108 becomes a λ/2 resonator.

Herein, "the dielectric" in the present specification is a substance in which a dielectric property is superior to a conductive property and is a material behaving as an insulator or a high value resistor that does not conduct electricity with respect to a direct-current voltage. Typically, a material having a resistivity of 1 kΩ·m or higher is preferable. A specific example includes resin, plastic, ceramic, silicon oxide, silicon nitride, or the like.

The bias circuit 120 supplies a bias voltage to each of the two negative resistance elements 101a and 101b. The bias circuit 120 includes a resistance 110 connected in parallel to each of the two negative resistance elements 101a and 101b, and a capacitance 109, a power source 112, and a wiring 111 connected in parallel to the resistance 110. The wiring 111 is illustrated as the inductance in FIGS. 1A and 1B since parasitic inductance components are certainly accompanied.

The power source 112 supplies a current needed to drive the negative resistance elements 101a and 101b and adjusts the bias voltage. The bias voltage is typically selected from the differential negative resistance area of each of the two negative resistance elements 101a and 101b.

The bias circuit 120 is connected to the antenna 108 via the line 103 and supplies electric power to the negative resistance elements 101a and 101b. The line 103 according to the present embodiment is a micro strip line. That is, the line 103 has a configuration including two conductors and the dielectric 104 arranged between the two conductors.

The resistance 110 and the capacitance 109 in the bias circuit 120 suppress a parasitic oscillation at a resonance frequency $f_{sp}$ of a relatively low frequency caused by the bias circuit 120 ($f_{sp}<f_{LC}<f_{THz}$, typically, a frequency band from DC to 10 GHz).

Herein, a frequency $f_{LC}$ denotes a frequency of an LC resonance by a capacitance C of the antenna 108 including an inductance L of the line 103 and the two negative resistance elements 101a and 101b. A detail of this will be described below.

A value equal to or a lower to some extent than an absolute value of a total of the differential negative resistances in the differential negative resistance areas of the respective negative resistance elements 101a and 101b is preferably selected as a value of the resistance 110. The resistance 110 is arranged at a position away from each of the negative resistance elements 101a and 101b by a distance $d_2$. The bias circuit on an outer side with respect to the resistance 110 preferably takes a low impedance from the viewpoint of the negative resistance elements 101a and 101b in a wavelength band higher than or equal to 4×$d_2$, that is, a low impedance when the absolute value of the differential negative resistance of the negative resistance elements 101a and 101b is set as a reference. In other words, the resistance 110 is preferably set to take a low impedance from the viewpoint of the negative resistance elements 101a and 101b in a wavelength band lower than or equal to $f_{SP}$ ($f_{SP} < f_{LC} < f_{THz}$).

With regard to the capacitance 109, a value equal to or lower to some extent than an absolute value of a total of the differential negative resistances of the two respective negative resistance elements 101a and 101b is preferably selected as the impedance of the capacitance 109. In general, the capacitance 109 preferably has a large capacitance, and according to the present embodiment, approximately several tens of pF is set. The capacitance 109 becomes a decoupling capacitance directly connected to the micro strip line corresponding to the line 103, and for example, an MIM (Metal-insulator-Metal) structure in which the antenna 108 and a substrate (not illustrated) are put together may be used.

Because of the structure of the antenna 108, it is not easy to directly connect the bias circuit 120 including the resistance 110 and the capacitance 109 to the antenna 108 without interference with a resonance electric field at the oscillation frequency $f_{THz}$. For this reason, to supply the bias voltage to each of the negative resistance elements 101a and 101b, the bias circuit 120 and the antenna 108 need to be connected via the line 103 corresponding to a feeding line. Thus, the line 103 is arranged at a position closer to the negative resistance elements 101a and 101b than the bias circuit 120.

For the reason, in the related-art element, the parasitic oscillation due to the LC resonance at the frequency $f_{LC}$ ($f_{LC} \approx 1/\{2\sqrt{\pi}(LC)\}$, $f_{SP} < f_{LC} < f_{THz}$) caused by the inductance L of the line and the capacitance C of the negative resistance element and the antenna may occur in some cases. In particular, since a micro strip antenna such as a patch antenna has a structure in which the dielectric is sandwiched by the two conductors and the capacitance C because of the structure is generated, a reduction in the above-described parasitic resonance becomes a problem.

The frequency $f_{LC}$ of the parasitic oscillation is mainly determined in the oscillator 100 by a capacitance of each of the negative resistance elements 101a and 101b, a length and a width of the line 103, the area of the antenna 108 (for example, the area of the upper conductor 102), a thickness of the dielectric 104, arrangements and structures of the line 103 and the resistance 110, and the like. Typically, the frequency $f_{LC}$ is set in a range between several GHz or higher and 500 GHz or lower. For example, when the length of the line 103 is set as $d_1$, and the distance between the negative resistance elements 101a and 101b and the resistance 110 is set as $d_2$, a frequency band in the vicinity of the frequency $f_{LC}$ is a wavelength band higher than or equal to $4 \times d_1$ and lower than or equal to $4 \times d_2$ in terms of wavelength.

The width of the line 103 is preferably a dimension to such an extent that the resonance electric field in the antenna 108 is not interfered and is preferably $\lambda_{THz}/10$ or lower, for example.

Herein, $\lambda_{THz}$ is a wavelength of the terahertz wave at the oscillation frequency $f_{THz}$.

In addition, the line 103 is preferably arranged at a node of an electric field (node) of the terahertz wave at the oscillation frequency $f_{THz}$ standing in the antenna 108 and connected to the antenna 108 at a position of the node. When the arrangement is performed in this manner, the line 103 has a configuration in which an impedance is higher than an absolute value of the differential negative resistance of each of the negative resistance elements 101a and 101b in a frequency band in the vicinity of the oscillation frequency $f_{THz}$. For the reason, it is possible to reduce the influence by the line 103 on the electric field at the oscillation frequency $f_{THz}$ in the antenna 108.

Herein, "the node of the electric field of the terahertz wave at the oscillation frequency $f_{THz}$ standing in the antenna 108" refers to an area substantially functioning as the node of the electric field of the terahertz wave at the oscillation frequency $f_{THz}$ standing in the antenna 108. Specifically, this is an area where an electric field intensity of the terahertz wave at the oscillation frequency $f_{THz}$ standing in the antenna 108 is lower than a maximum electric field intensity of the terahertz wave at the oscillation frequency $f_{THz}$ standing in the antenna 108 by approximately an order of magnitude. More desirably, a position is preferable where the electric field intensity of the terahertz wave at the oscillation frequency $f_{THz}$ standing in the antenna 108 becomes lower than or equal to $1/e^2$ (e denotes a base of a natural logarithm) of the maximum electric field intensity of the terahertz wave at the oscillation frequency $f_{THz}$ standing in the antenna 108.

Herein, the oscillation condition for the oscillator 100 according to the present embodiment will be described in more detail. In general, an oscillation frequency of an active antenna in which the antenna and the differential negative resistance element are integrated is determined as a resonance frequency of a full parallel resonance circuit in which the reactances of the antenna and the differential negative resistance element are combined with each other. Specifically, the oscillation frequency $f_{THz}$ is determined with regard to the resonance circuit in which the admittances of the RTD and the antenna are combined with each other from the equivalent circuit of the RTD oscillator described in NPL 1. Specifically, with regard to the resonance circuit in which the admittances of the RTD and the antenna are combined with each other, a frequency that satisfies two conditions of an amplitude condition of Expression (2) and a phase condition of Expression (3) is determined as the oscillation frequency $f_{THz}$.

It should be noted that $Y_{11}$ denotes an admittance of the entire configuration including the antenna 108 as viewed from the first negative resistance element 101a, and $Y_{RTD}$ denotes an admittance of the first negative resistance element 101a of the second negative resistance element 101b corresponding to the differential negative resistance element.

Herein, the entire configuration refers to all members constituting the oscillator 100 such as the antenna 108, the line 103, and the bias circuit 120. That is, $Re(Y_{11})$ denotes a real part of the admittance of the entire structure including the antenna 108 as viewed from the first negative resistance element 101a, and $Im(Y_{11})$ denotes an imaginary part of the admittance of the entire structure including the antenna 108 as viewed from the first negative resistance element 101a.

In addition, $Re(Y_{RTD})$ denotes a real part of the admittance of the first negative resistance element 101a or the second negative resistance element 101b, and $Im(Y_{RTD})$ denotes an imaginary part of the admittance of the first negative resistance element 101a or the second negative resistance element 101b. $Re[Y_{RTD}]$ has a negative value.

$$Re(Y_{RTD}) + Re(Y_{11}) \leq 0 \qquad (2)$$

$$Im(Y_{RTD}) + Im(Y_{11}) = 0 \qquad (3)$$

Figure 2A:
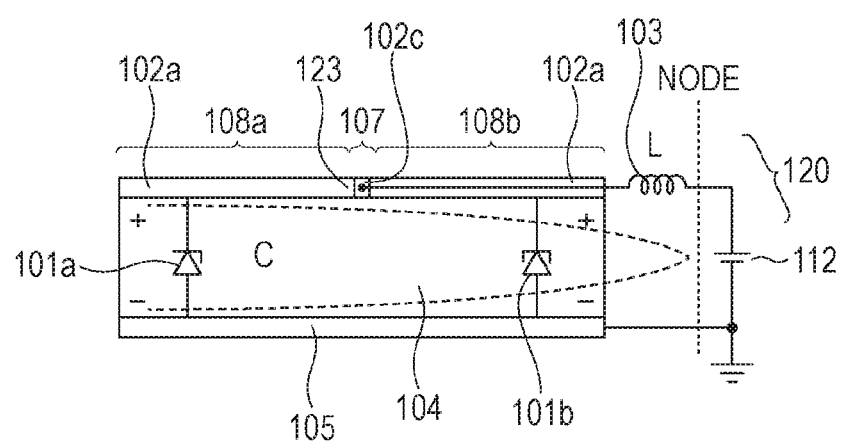
FIGS. 2A and 2B are explanatory diagrams for describing the configuration of the element according to the embodiment.
Figure 2B:
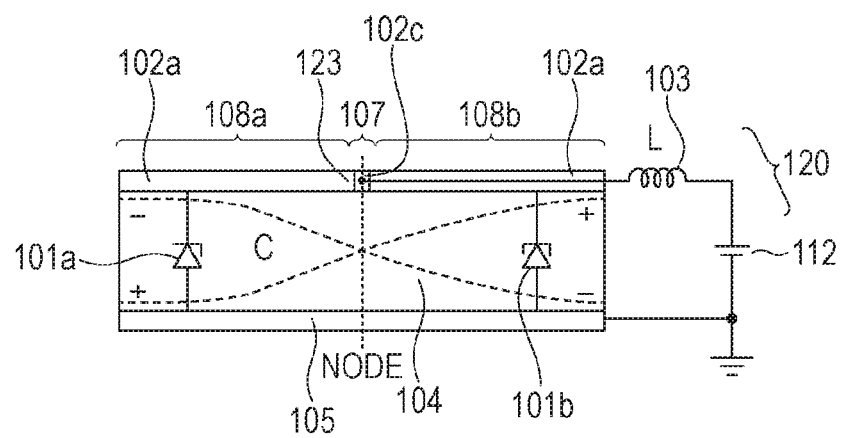

The antenna 108 according to the present embodiment is an integrated antenna including at least two or more negative resistance elements corresponding to the first negative resistance element 101a and the second negative resistance element 101b. In the above-described case, as illustrated in FIGS. 2A and 2B, the antenna 108 can be regarded as coupling between the first negative resistance element 101a where a first antenna unit 108a is integrated and a second antenna unit 108b where the second negative resistance element 101b is integrated are coupled by a coupling part 107 to each other. In this case, the first antenna unit 108a, the second antenna unit 108b, and the coupling part 107 are aligned and arranged along the resonance direction of the terahertz wave in the antenna 108.

That is, the antenna 108 is regarded as the integrated antenna in which the first antenna unit 108a and the second antenna unit 108b are coupled to each other by the coupling part 107, and the oscillation conditions for the oscillator 100 can be considered. Specifically, when injection locking in a mutual manner in the configuration disclosed in NPL 2 in which two individual RTD oscillators are coupled to each other (mutual injection locking) is considered, the oscillation frequency $f_{THz}$ is determined.

Herein, the mutual injection locking means that all of a plurality of self-excited oscillators oscillate due to pull-in locking by mutual effects.

Herein, for approximation, it is assumed that the admittance of the first negative resistance element 101a is equal to the admittance of the second negative resistance element 101b. At this time, two oscillation modes of the mutual injection locking in a positive phase and the mutual injection locking in a reversed phase are generated. Oscillation conditions for the oscillation mode of the mutual injection locking in the positive phase (even mode) are represented by Expression (4) and Expression (5), and oscillation conditions for the oscillation mode of the mutual injection locking in the reversed phase (odd mode) are represented by Expression (6) and Expression (7).

Positive phase (even mode): frequency $f=f_{even}$ $$Y_{even}=Y_{11}+Y_{12}+Y_{RTD}\text{Re}(Y_{even})\leq 0 \quad (4)$$

$$\text{Im}(Y_{even})=0 \quad (5)$$

Opposite phase (odd mode): $f=f_{odd}$ $$Y_{odd}=Y_{11}-Y_{12}+Y_{RTD}\text{Re}(Y_{odd})\leq 0 \quad (6)$$

$$\text{Im}(Y_{odd})=0 \quad (7)$$

Where $Y_{12}$ denotes a mutual admittance between the negative resistance element 101a and the negative resistance element 101b.

For example, as illustrated in FIG. 1B, the antenna 108 can be regarded as the configuration in which the first antenna unit 108a and the second antenna unit 108b are coupled by DC coupling corresponding to the strong coupling by the coupling part 107. The first antenna unit 108a and the second antenna unit 108b have the structure of the patch antenna.

It should be noted that "the strong coupling" in the present specification can be defined by a real part Re(k) of a coupling coefficient k between the first antenna unit and the second antenna unit. That is, "the strong coupling" in the present specification means that an absolute value of Re(k) becomes higher than ⅓. According to the present embodiment, the first antenna unit 108a and the second antenna unit 108b are coupled to each other such that the absolute value of Re(k) becomes higher than ⅓.

Specifically, the first antenna unit 108a includes a first conductor layer 102a, the second conductor 105, the dielectric 104, and the first negative resistance element 101a connected between the first conductor layer 102a and the second conductor 105. The first antenna unit 108a is the patch antenna in which the dielectric 104 is arranged between the first conductor layer 102a and the second conductor 105.

In addition, the second antenna unit 108b includes a second conductor layer 102b, the second conductor 105, the dielectric 104, and the second negative resistance element 101b connected between the second conductor layer 102b and the second conductor 105. The second antenna unit 108b is the patch antenna in which the dielectric 104 is arranged between the second conductor layer 102b and the second conductor 105.

The coupling part 107 includes a third conductor layer 102c, the second conductor 105, and the dielectric 104 arranged between the third conductor layer 102c and the second conductor 105.

In the upper conductor 102, the first conductor layer 102a and the second conductor layer 102b are connected to each other by the third conductor layer 102c. That is, the third conductor layer 102c is a connection part that connects the first conductor layer 102a to the second conductor layer 102b. The first conductor layer 102a and the second conductor layer 102b are aligned and arranged on the dielectric 104 without being overlapped with each other.

Herein, the second conductor 105 is an earth conductor, and according to the present embodiment, the first antenna unit 108a, the second antenna unit 108b, and the coupling part 107 have used a common conductor layer. However, the configuration is not limited to this, and for example, the second conductor 105 may be configured by using different conductor layers for the first antenna unit 108a, the second antenna unit 108b, and the coupling part 107.

In addition, according to the present embodiment, the first antenna unit 108a, the second antenna unit 108b, and the coupling part 107 use the dielectric 104 as a common dielectric layer. However, the configuration is not limited to this, and for example, the first antenna unit 108a, the second antenna unit 108b, and the coupling part 107 may also be configured by using different dielectrics. The configuration according to the present embodiment takes a configuration in which the upper conductor 102 connects the first conductor layer 102a and the second conductor layer 102b by the third conductor layer 102c corresponding to the connection part.

The second antenna unit 108b preferably has a mirror symmetrical structure while a plane passing through the coupling part 107 and being perpendicular to a lamination direction of the upper conductor 102 and the second conductor 105 is set as a reference. That is, in a case where the first antenna unit 108a is set as the resonator, when one of radiation ends is set as an axis 123, the second antenna unit preferably has a mirror symmetrical structure inverted at the axis 123.

Herein, the radiation ends refer to both ends of the antenna in a resonance direction in an electromagnetic field of the resonance frequency of the patch antenna. The radiation ends are parts where a current of the electromagnetic field at the resonance frequency of the patch antenna is minimized, a voltage is maximized, and an electric wave is radiated.

It should be noted that the first antenna unit 108a and the second antenna unit 108b do not necessarily need to be completely mirror symmetrical and may be sufficient to be in a range regarded as being mirror symmetrical. For example, in a case where a design is performed while the first antenna unit 108a and the second antenna unit 108b are set to be mirror symmetrical, actually created ones within a range indicating characteristics expected in a design stage may also be regarded as being mirror symmetrical.

The first antenna unit 108a and the second antenna unit 108b are electrically coupled by the coupling part 107 arranged at the axis 123 to constitute the antenna 108. At this time, a configuration is adopted in which the first negative resistance element 101a and the second negative resistance element 101b are mutually connected in parallel.

It should be noted that a method of electrically coupling the first antenna unit 108a to the second antenna unit 108b includes DC coupling or AC coupling, and according to the present embodiment, the DC coupling between the first antenna unit 108a and the second antenna unit 108b is realized by the coupling part 107. In this case, the first conductor layer 102a of the first antenna unit 108a, the second conductor layer 102b of the second antenna unit 108b, and the third conductor layer (connection part) 102c of the coupling part 107 are integrally formed as a single conductor layer.

It should be noted that a case where the AC coupling between the first antenna unit 108a and the second antenna unit 108b is performed by the coupling part 107 will be described below.

The configuration of the oscillator 100 according to the present embodiment disclosed in FIGS. 1A and 1B corresponds to the DC coupling and also respective widths in a horizontal direction orthogonal to the IB-IB direction of the first antenna unit 108a, the second antenna unit 108b, and the coupling part 107 are the same. That is, an antenna where the antenna units 108a and 108b are electrically coupled by the coupling part 107 is substantially the same as the antenna 108 where the patch antenna in which the dielectric 104 is sandwiched by the upper conductor 102 and the second conductor 105 and the negative resistance elements 101a and 101b are integrated. The upper conductor 102 includes the first conductor layer 102a, the second conductor layer 102b, and the third conductor layer 102c.

When conditions for realizing the mutual injection locking in the configuration in which the above-described two RTD oscillators are coupled to each other are considered, the two oscillation modes of the positive phase and the reversed phase are generated. FIG. 2A illustrates a conceptual diagram of an oscillation mode of the mutual injection locking in the positive phase (hereinafter, referred to as a "positive phase mode"), and FIG. 2B illustrates a conceptual diagram of an oscillation mode of the mutual injection locking in the reversed phase (hereinafter, referred to as a "reversed phase mode").

Figure 3:
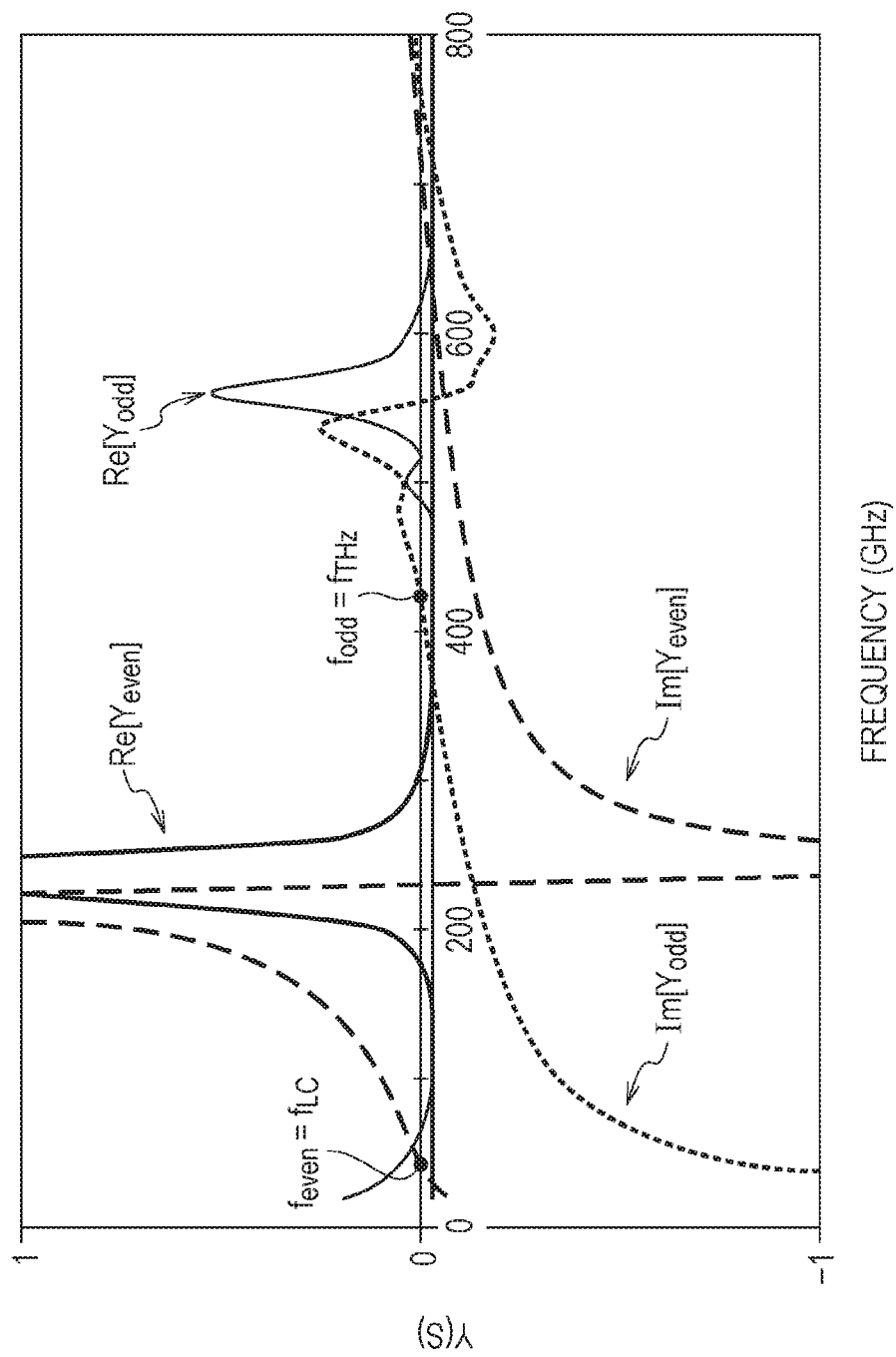
FIG. 3 is an explanatory diagram for describing an admittance characteristic of an element according to Example 1.

In addition, FIG. 3 illustrates an admittance characteristic of the oscillator 100.

As illustrated in FIG. 2A, in the case of the positive phase mode, the electromagnetic wave standing in the element at the frequency $f_{even}$ is injected into each of the negative resistance elements 101a and 101b with the phase difference of 0 or $2\pi$. Therefore, the phase difference between the phase of the first negative resistance element 101a and the phase of the second negative resistance element 101b becomes 0 or $2\pi$, and the magnitudes and the polarities of the electromagnetic fields at the resonance frequency become substantially the same. As also understood from the analysis result of FIG. 3, since the oscillation condition based on the locking in the positive phase in the LC resonance at the frequency $f_{LC}$ caused by the capacitance C of the antenna 108 and the inductance L of the line 103 is satisfied, the parasitic oscillation at the frequency $f_{even}=f_{LC}$ occurs in the positive phase mode. In this case, the node of the LC resonance (node) occurs in the vicinity of the connection part between the line 103 and the bias circuit 120.

On the other hand, as illustrated in FIG. 2B, in the case of the reversed phase mode, the electromagnetic wave standing in the element is injected into each of the negative resistance elements 101a and 101b at the frequency $f_{odd}$ with the phase difference of $\pi$. Therefore, the polarity of the electromagnetic field of the first negative resistance element 101a and the polarity of the electromagnetic field of the second negative resistance element 101b at the resonance frequency are inverted. This electromagnetic field distribution is substantially matched with the electromagnetic field distribution at the resonance frequency of the patch antenna where the negative resistance elements 101a and 101b are excluded from the antenna 108.

It should be noted that "the first negative resistance element 101a and the second negative resistance element 101b are in the reversed phases" in the present specification refers to a range where the phase difference between the first negative resistance element 101a and the second negative resistance element 101b becomes $\pm\pi/8$ or lower from the phase difference $\pi$ at which the complete reversed phase is realized. That is, "the first negative resistance element 101a and the second negative resistance element 101b are in the reversed phases" in the present specification is specifically defined that the phase difference between the first negative resistance element 101a and the second negative resistance element 101b is higher than or equal to $7\pi/8$ and lower than or equal to $9\pi/8$.

As also apparent in the admittance characteristic of FIG. 3, since the oscillation condition is satisfied at the desired frequency $f_{THz}$ regulated by the resonance frequency of $\lambda/2$ of the patch antenna in the case of the reversed phase mode, the oscillation of the terahertz wave at $f_{odd}=f_{THz}$ occurs. Qualitatively, since the polarities of the electromagnetic field of the respective negative resistance elements 101a and 101b are inverted in the case of the reversed phase, the capacitance C of the patch antenna is cancelled, and it is also conceivable that the LC resonance point is not generated.

In this case, the node of the electromagnetic field (node) at the desired frequency $f_{THz}$ regulated by the resonance frequency of $\lambda/2$ is in the vicinity of a center line passing through a gravity center of the first conductor 102 of the antenna 108 in the first conductor 102.

It should be noted that "the center line" in the present specification refers to a straight line passing through the gravity center of the first conductor 102 in the first conductor 102 and also being perpendicular to the resonance direction of the electromagnetic wave and the lamination direction of the first conductor 102 and the second conductor 105.

In the example of the DC coupling corresponding to the strong coupling described in the present embodiment, in a case where the coupling part 107 is downsized to the utmost, the axis 123 and the node of the electromagnetic field (node) at the frequency $f_{THz}$ are matched with each other. Therefore, it may also be mentioned that the second antenna unit 108b has a mirror symmetrical structure while the first antenna unit 108a is inverted at the node of the electromagnetic field distribution (node) in a case where the electromagnetic waves at the resonance frequency of $\lambda/2$ of the antenna 108 stand in the antenna 108.

In addition, the first antenna unit 108a and the second antenna unit 108b are electrically coupled by the coupling part 107 to constitute the antenna 108. The coupling part 107 is arranged at the node of the electromagnetic field distribution (node) of the electromagnetic waves at the resonance frequency of λ/2 of the antenna 108 standing in the antenna 108.

The present embodiment is aimed at the reduction in the parasitic oscillation caused by the inductance of the line corresponding to the specific problem when the negative resistance element is integrated in the micro strip antenna in an oscillation element including an antenna where a plurality of negative resistance elements are electrically connected.

According to the related-art technology, in the oscillator including the antenna and the plurality of negative resistance elements electrically connected to the antenna in series and mutually connected in parallel, each of the plurality of negative resistance elements is arranged at a position where the phases of the electromagnetic waves from the respective negative resistance elements mutually become the positive phase or the reversed phase. However, in the related-art oscillator having the above-described configuration, in a case where the antenna 108 is considered as an array antenna in which the two antenna units are coupled to each other as described above, there is a fear that the two oscillation modes of the positive phase and the reversed phase may be generated. In general, the low frequency tends to be more stabilized and easily oscillate, and when the positive phase on the low frequency side is stabilized to be locked, there is a fear that the low frequency oscillation or multi oscillation based on the LC resonance occurs to reduce an oscillation output.

Herein, a state in which the oscillation mode in the reversed phase is stable means that the oscillation based on a mode other than the mode oscillation at the resonance frequency in the reversed phase is suppressed in a system where a large number of resonance points exist, and the substantially single mode oscillation at the resonance frequency in the reversed phase can be obtained. Specifically, this means that the electric field intensity of the electromagnetic wave that oscillates in a mode other than the oscillation mode in the reversed phase becomes lower than the maximum electric field intensity of the terahertz wave where the mode oscillation has occurred at the resonance frequency in the reversed phase by approximately an order of magnitude or lower. Desirably, the electric field intensity of the electromagnetic wave in an oscillation mode other than the oscillation mode in the reversed phase becomes lower than or equal to $1/e^2$ (e denotes a base of a natural logarithm) of the maximum electric field intensity of the terahertz wave of the oscillation frequency in the reversed phase.

In contrast, the oscillator 100 according to the present embodiment is configured to destabilize the positive phase mode and stabilize the reversed phase mode, so that the oscillation of the electromagnetic wave at the low frequency by the parasitic oscillation is reduced.

According to NPL 2, a condition for destabilizing the positive phase in the mutual injection locking in the antenna array in which the plurality of RTD oscillators are coupled to each other is to satisfy Expression (8) at the frequency $f_{even}$ in the positive phase.

$$\mathrm{Re}(k) = -\mathrm{Re}(Y_{12}) \times [G - \mathrm{Re}(Y_{11})]^{-1} < -\frac{1}{3} \qquad (8)$$

Herein, k denotes a coupling coefficient between the first antenna unit 108a and the second antenna unit 108b. G denotes one of gains of the negative resistance elements 101a and 101b and is matched with an absolute value ($|\mathrm{Re}(Y_{RTE})|$) of $\mathrm{Re}(Y_{RTD})$.

When this is transformed, the oscillator 100 preferably satisfies Expression (1). When Expression (1) is satisfied, the positive phase mode is destabilized, and it is possible to stabilize the reversed phase mode.

[Math. 1]

$$\mathrm{Re}(Y_{12}) > \frac{1}{3}[G - \mathrm{Re}(Y_{11})] \qquad (1)$$

Figure 4:
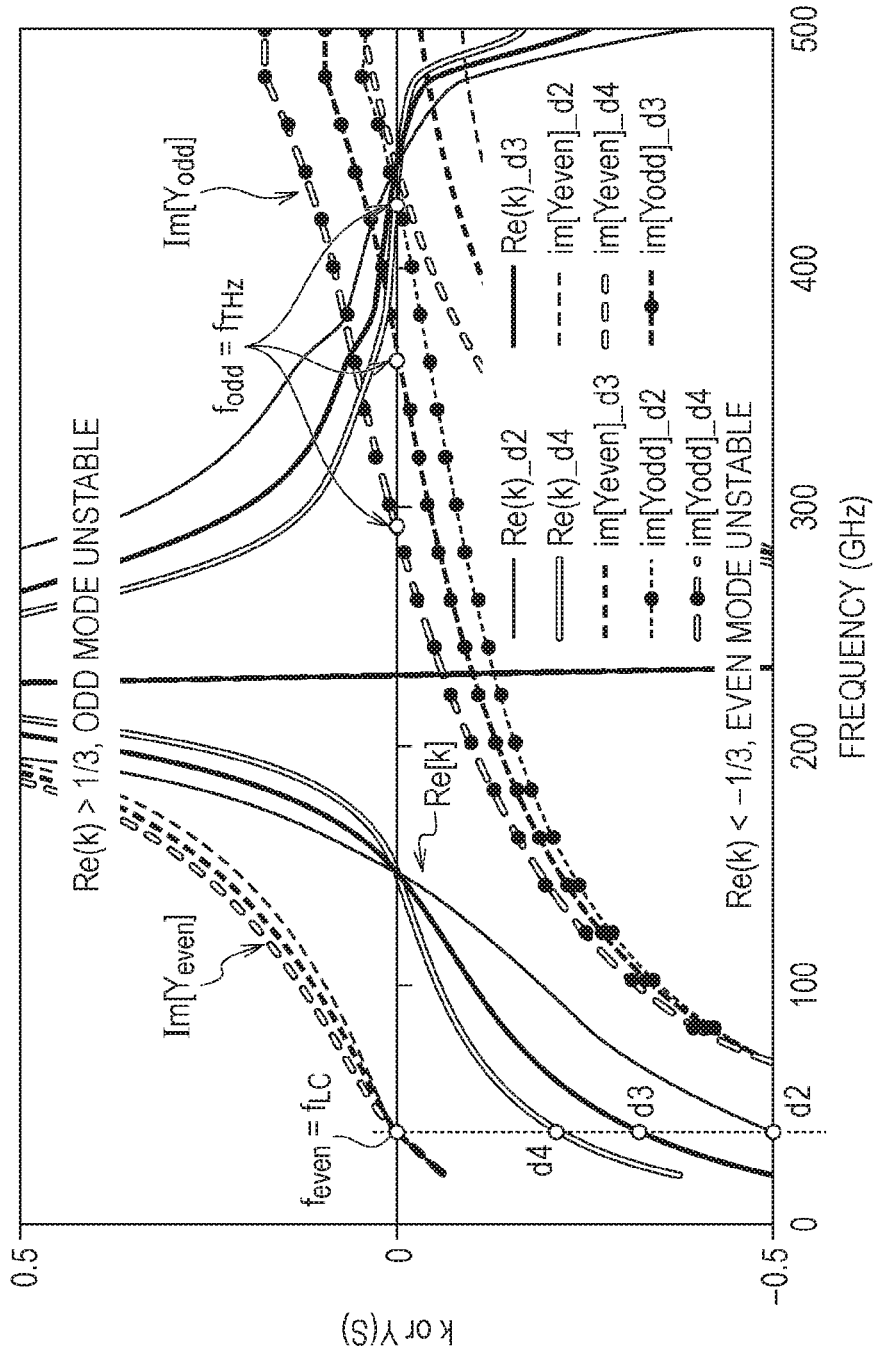
FIG. 4 is an explanatory diagram for describing a characteristic of the element according to Example 1.

FIG. 4 illustrates a result of an analysis of the coupling coefficient k with regard to the oscillator 100.

It should be noted that a detailed configuration of the oscillator 100 will be described in Example 1.

FIG. 4 is an example of analyzing frequency characteristics of the coupling coefficients Re(k) in the case of the positive phase mode (in a case where the oscillation is performed at $f=f_{even}=f_{LC}$) and the case of the reversed phase mode (in a case where the oscillation is performed at $f=f_{odd}=f_{THz}$). An analysis is performed by changing a diameter of a mesa (mesa diameter) of the RTD corresponding to the negative resistance elements 101a and 101b, $d_2$ indicates a result in a case where the mesa diameter is 2 μm, $d_3$ indicates a result in a case where the mesa diameter is 3 μm, and $d_4$ indicates a result in a case where the mesa diameter is 4 μm.

Herein, since the area of the mesa of the RTD (such as the area of the diode or the area of a hetero junction plane) relies on the mesa diameter, the mesa diameter is a designing parameter for controlling injection power and a diode capacitance and contributes to the gain G and the oscillation frequency f.

From FIG. 4, since G becomes high when the mesa diameter is increased, Re(k)<-⅓ is not satisfied, and since Expression (1) is not satisfied, the positive phase is stabilized. For the reason, the electromagnetic wave at $f=f_{even}=f_{LC}$ is oscillated. On the other hand, when the mesa diameter is set to be smaller than 3 μm, Re(k)<-⅓ is satisfied, and Expression (1) is satisfied, so that the positive phase is destabilized. For the reason, the oscillation at $f=f_{odd}=f_{THz}$ corresponding to the high frequency in the reversed phase is obtained.

In this manner, in the antenna 108 provided with the plurality of negative resistance elements 101a and 101b, by adjusting the mesa diameter the negative resistance elements 101a and 101b, the positive phase ($f_{even}=f_{LC}$) is selectively destabilized, and the reversed phase ($f_{odd}=f_{THz}$) can be stabilized.

As described according to the present embodiment, controlling of the gain G by the mesa diameter of the RTD becomes one effective means.

In the antenna 108, the following configuration is preferable as a configuration in which the locking in the positive phase at $f=f_{even}=f_{LC}$ is selectively destabilized (that is, satisfying Expression (1)).

First, a coupling coefficient $Y_{12}$ between the two mutual antenna units of the first antenna unit 108a and the second antenna unit 108b is increased. For that purpose, as in the present embodiment, the coupling is preferably performed by the DC coupling of the strong coupling. It is. It should be noted however that since a risk that multimode occurs is high in the case of the strong coupling, to suppress it, the first antenna unit 108a and the second antenna unit 108b preferably take a structure of a mirror symmetry while a plane passing through the coupling part 107 and being in parallel with the lamination direction is set as a reference.

Figure 6A:
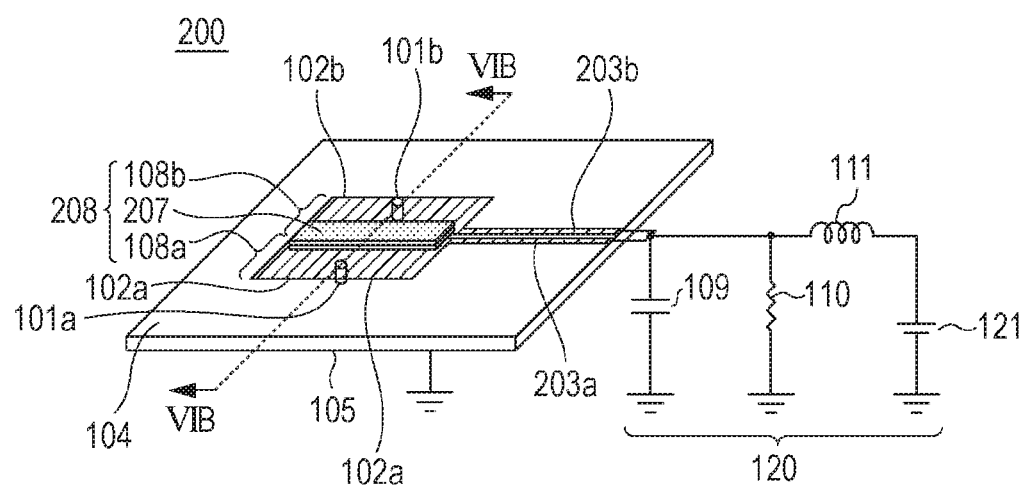
FIGS. 6A and 6B are explanatory diagrams for describing a configuration of the element according to Example 2.
Figure 6B:
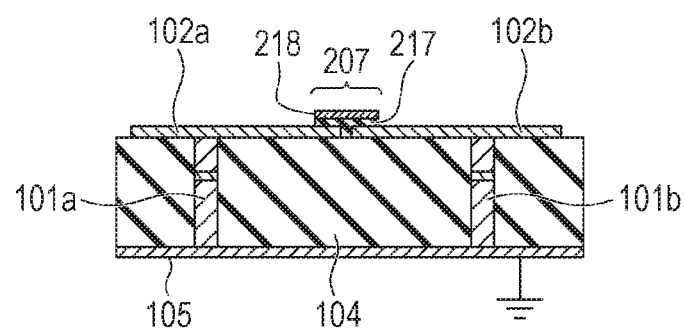

It should be noted that the first antenna unit 108a and the second antenna unit 108b may be coupled to each other by the AC coupling. In the above-described case too, a mirror symmetrical structure in which the strong coupling in which the coupling coefficient $Y_{12}$ is relatively high and also the multimode is suppressed is preferable as illustrated in FIGS. 6A and 6B.

As a method of destabilizing the positive phase, a structure in which the load of the antenna 108 (that is, $Re(Y_{11})$) is increased is also preferable.

It should be noted that, in this case, such a structure that $f=f_{odd}=f_{THz}$ stabilized in the reversed phase satisfies the oscillation condition is also a necessary condition.

Figure 5:
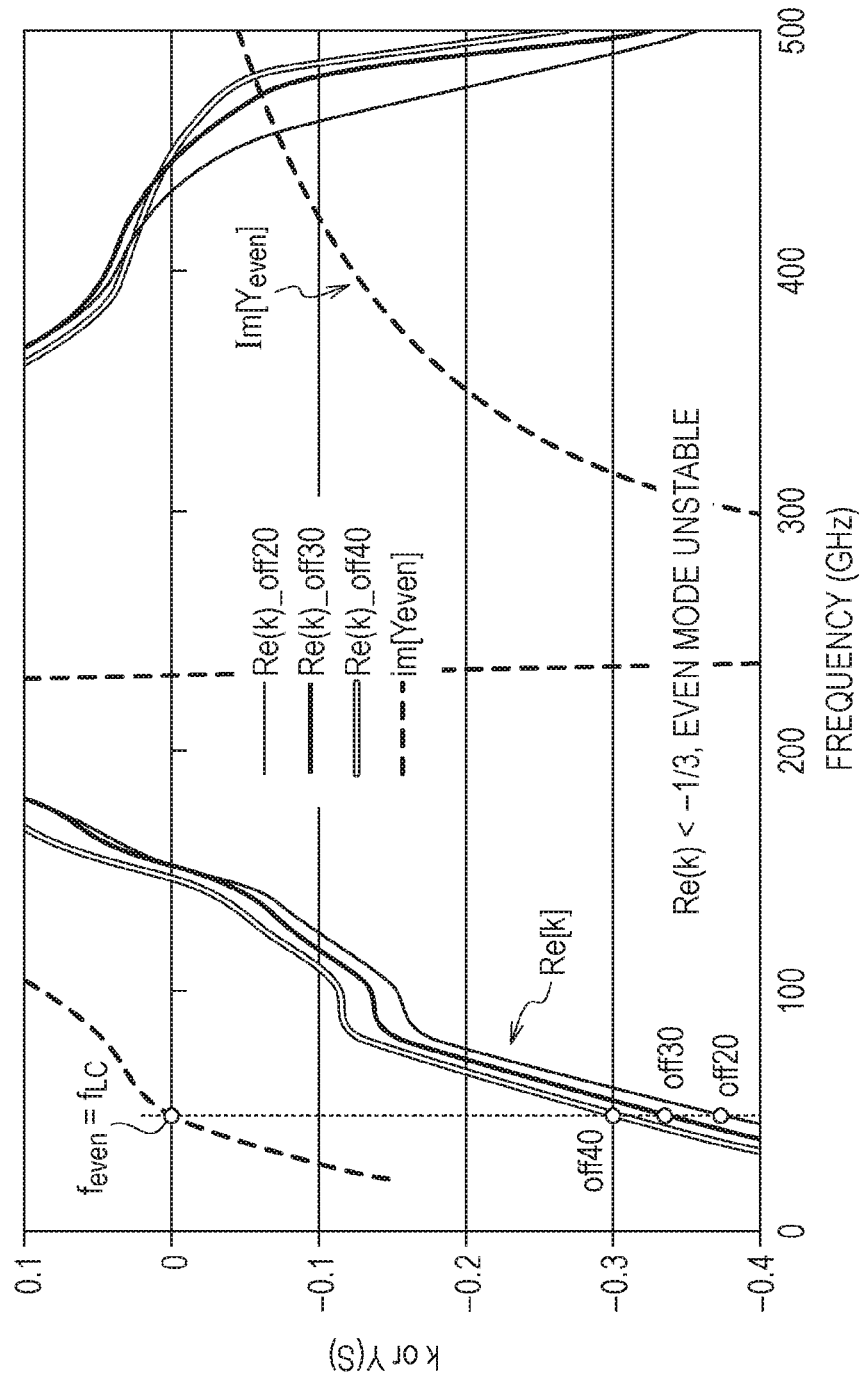
FIG. 5 is an explanatory diagram for describing the characteristic of the element according to Example 1.

FIG. 5 illustrates an analysis result of a coupling coefficient $Re(k)$ in a case where the input impedance is changed at each of feeding positions of the first negative resistance element 101a and the second negative resistance element 101b to adjust the load of the antenna 108.

Herein, off represents the feeding position of the negative resistance elements 101a and 101b, x is set as a distance in the IB-IB direction (resonance direction) from the gravity center of the first conductor 102 of the antenna 108 to the radiation end, L is set as a resonator length of the antenna 108, and off=x/L is established.

It should be noted that FIG. 5 is a result of the analysis with regard to the coupling coefficient $Re(k)$ in a case where the mesa diameter of the RTD is 3 μm in the oscillator 100 in Example 1 which will be described below.

Since the oscillator 100 in Example 1 has L=200 μm, the negative resistance elements 101a and 101b are arranged at the positions of x=80 μm in the case of off40. In this case, the positive phase is stabilized since $Re(k) > -1/3$ is established, and the LC oscillation occurs by the locking in the positive phase at $f_{even}=f_{LC}$. On the other hand, the positions of the negative resistance elements 101a and 101b further approach the center of the patch antenna as it turns to off30 and off20, and the positive phase is destabilized because the condition of $Re(k) < -1/3$ is satisfied, so that the locking in the reversed phase occurs to obtain the oscillation at $f_{odd}=f_{THz}$.

In this manner, when the input impedances of the negative resistance elements 101a and 101b are changed to adjust the load of the antenna 108, the selection of the stabilization can be performed by adjusting $Re(Y_{11})$ of $Re(k)$.

In addition, the selection of the stabilization can also be performed by adjusting $Re(Y_{11})$ by a structure outside the antenna 108. For example, when the impedance of the line 103 as viewed from the negative resistance elements 101a and 101b is designed to be low to adjust $Re(Y_{11})$ at $f_{even}=f_{LC}$, Expression (1) is satisfied, and it is also possible to select the destabilization in the positive phase mode. In this case, it is more effective to the destabilization in the positive phase mode as a low impedance structure of the line 103 is closer to the negative resistance elements 101a and 101b and the antenna 108. Specifically, the arrangement at a distance lower than or equal to $\lambda_{THz}$ from the negative resistance elements 101a and 101b is preferably.

It should be noted that $\lambda_{THz}$ denotes a wavelength of the terahertz wave at the oscillation frequency $f_{THz}$.

The present embodiment can be applied as the antenna 108 as long as this is a structure in which the oscillation at the frequency $f_{LC}$ caused by a capacitive C like the micro strip antenna and an inductive L caused by the feeding line directly connected to the antenna 108 may be generated. For example, a planar antenna or a solid antenna such as a general dipole antenna, a slot antenna, a patch antenna, a Cassegrain antenna, or a parabola antenna can be used as the antenna 108. Even in the case of the above-described various antennas, the present embodiment can be used when the oscillation caused by the capacitive C generated because of the structure of the integrated antenna and the inductive L generated on the basis of the feeding structure becomes a problem.

The oscillator 100 according to the present embodiment suppresses the occurrence of the parasitic oscillation caused by the wiring structure corresponding to a problem in a micro strip type oscillator including a patch antenna. Specifically, in the oscillator including the antenna 108 provided with two or more negative resistance elements, a configuration is adopted in which the positive phase is selectively destabilized, and the mutual injection locking in the reversed phase mode is stabilized. When the above-described configuration is adopted, the LC resonance caused by the capacitance of the antenna 108 and the inductance of the bias feeding line is reduced.

With this configuration, according to the oscillator 100 of the present embodiment, it is possible to reduce or suppress the parasitic oscillation at the relatively high frequency in the frequency domain higher than or equal to DC and lower than $f_{THz}$. As a result, the terahertz wave at the desired oscillation frequency $f_{THz}$ of the oscillator 100 can be more stably obtained.

When the terahertz wave at the oscillation frequency $f_{THz}$ can be stably obtained, the terahertz wave at the desired oscillation frequency $f_{THz}$ in the micro strip type oscillator can be obtained at an even higher output. Specifically, since the frequency oscillation or the multi oscillation can be suppressed, it becomes possible to increase the oscillation output by an order of magnitude or higher at the desired oscillation frequency $f_{THz}$.

Example 1

According to the present example, the configuration of the oscillator 100 according to the embodiment will be described. The oscillator 100 in the present example is an oscillation element that oscillates the oscillation frequency $f_{THz}$=0.42 THz.

According to the present example, the resonant tunneling diode (RTD) is used as the negative resistance elements 101a and 101b. Hereinafter, the first negative resistance element 101a may be referred to as the first RTD 101a and the second negative resistance element 101b may be referred to as the second RTD 101b in some cases. The first RTD 101a and the second RTD 101b used in the present example are configured by accompanying a multi-quantum well structure based on InGaAs/InAlAs and InGaAs/AlAs on an InP substrate (not illustrated) and an electric contact layer based on n-InGaAs.

A triple barrier structure is used as the multi-quantum well structure, for example. More specifically, this is configured by a semiconductor multi-layer film structure of AlAs (1.3 nm)/InGaAs (7.6 nm)/InAlAs (2.6 nm)/InGaAs (5.6 nm)/AlAs (1.3 nm). Among them, InGaAs is a well layer, and lattice matching InAlAs and incoherent AlAs are barrier layers. These layers are set as undoped layers where carrier doping is not intentionally performed.

The above-described multi-quantum well structure is sandwiched by the electric contact layers based on n-InGaAs in which an electron concentration is $2\times10^{18}$ cm$^{-3}$. A peak current density is 280 kA/cm$^2$ in a current voltage I (V) characteristic of the structure between the above-described electric contact layers, and it becomes the differential negative resistance area from approximately 0.7 V to approximately 0.9 V. For example, in a case of the mesa structure in which the first RTD 101*a* is approximately 2 μmφ, a peak current of 10 mA and the differential negative resistance of −20Ω are obtained.

The antenna 108 includes the upper conductor (patch conductor) 102, the patch antenna including the second conductor 105 corresponding to the earth conductor and the dielectric 104, the first RTD 101*a*, and the second RTD 101*b*. The antenna 108 includes a square patch antenna in which one side of the upper conductor 102 is 200 μm. 3 μm-thick BCB (benzocyclobutene, manufactured by Dow Chemical Company, $\varepsilon_r$=2.4) and 0.1 μm-thick silicon nitride are arranged as the dielectric 104 between the upper conductor 102 and the second conductor 105.

The first RTD 101*a* and the second RTD 101*b* having the diameter of 2 μm are connected between the upper conductor 102 and the second conductor 105. The first RTD 101*a* is arranged at a position shifted from the gravity center of the upper conductor 102 in the resonance direction by 80 μm in the upper conductor.

In addition, the second RTD 101*b* is arranged at a position shifted from the gravity center of the upper conductor 102 in the resonance direction by −80 μm. That is, the first RTD 101*a* and the second RTD 101*b* are arranged at axisymmetric positions while a straight line (center line) passing through the gravity center of the upper conductor 102 and also being perpendicular to the resonance direction and the lamination direction is set as an axis. In other words, the second RTD 101*b* is arranged at an axisymmetric position with respect to a position where the first RTD 101*a* is arranged while the center line is set as an axis in the upper conductor 102.

It should be noted that the first RTD 101*a* and the second RTD 101*b* do not necessarily need to be at the completely axisymmetric positions, and a range that may be regarded as axisymmetric is sufficient. For example, in a case where a design is performed while the first RTD 101*a* and the second RTD 101*b* are arranged at the axisymmetric positions, ones within a range indicating characteristics expected in a design stage may be regarded as being axisymmetric.

A sole resonance frequency of the patch antenna is approximately 0.48 THz. The oscillator 100 according to the present example has the admittance characteristic illustrated in FIGS. 2A and 2B, and the two locking modes of the positive phase mode and the reversed phase mode exist. When the reactances of the first and second RTDs 101*a* and 101*b* corresponding to the negative resistance elements are taken into account, the oscillation frequency (resonance frequency) $f_{THz}$ of the oscillator 100 in a case where the mutual injection locking is performed in the reversed phase becomes approximately 0.42 THz.

It should be noted that, in the case of the structure according to the present example, as illustrated in FIG. 4 too, when the mesa diameter of the RTDs 101*a* and 101*b* is lower than or equal to 2.5 μm, the positive phase is destabilized, and the mutual injection locking is performed in the reversed phase.

In addition, in the case of the structure according to the present example, as illustrated in FIG. 5 too, in a case where the diameter of the RTD mesa is 3 μm, when off=30% or lower (that is, x=60 μm or lower), Expression (1) is satisfied, and while the positive phase mode is destabilized and the reversed phase mode is stabilized, the mutual injection locking is performed in the reversed phase.

The upper conductor 102 is connected to the micro strip line corresponding to the line 103. With this configuration, the antenna 108 is connected to the capacitance 109 via the line 103. When the above-described configuration is adopted, the line 103 connects the bias circuit 120 to the antenna 108. A width of the line 103 (length in the resonance direction) is approximately 6 μm, and a length in a direction perpendicular to the resonance direction and the lamination direction is set as approximately 100 μm.

The capacitance 109 is an MIM capacitance, and a magnitude of the capacitance is 100 pF according to the present example. The resistance 110 is a shunt resistance, and a bismuth structure for setting 5Ω is integrated such that the resistance 110 takes a value lower than an absolute value of a combined negative resistances of the first and second RTDs 101*a* and 101*b*. The wiring 111 including wire bonding is connected to the capacitance 109, and the power source 112 adjusts the bias voltage of the first and second RTDs 101*a* and 101*b*. In the present structure, the resonance frequency when oscillating in the positive phase mode becomes approximately 0.05 THz at the frequency $f_{LC}$ the LC resonance formed by the inductance L of the micro strip line corresponding to the line 103 and the capacitance C of the integrated antenna 108.

The upper conductor 102 is connected to the line 103 at the node of the high frequency electric field standing in the antenna 108 at the oscillation frequency $f_{THz}$ (=0.42 THz) and suppresses interference with a resonance electric field of the line 103 and the terahertz wave at the oscillation frequency $f_{THz}$.

The oscillator 100 according to the present example is prepared as follows. First, epitaxial growth of the following layers is performed on the InP substrate by a molecular beam epitaxy (MBE) method, a metalorganic vapor phase epitaxy (MOVPE) method, or the like. That is, the epitaxial growth of the resonant tunneling diodes (RTDs) 101*a* and 101*b* based on n-InP/n-InGaAs and InGaAs/InAlAs is performed in sequence on the InP substrate. In a case where an n-type conductive substrate is selected as the InP substrate, the epitaxial growth is performed from n-InGaAs.

Next, etching of the first RTD 101*a* and the second RTD 101*b* is performed in a circular-arc mesa shape such that the diameter becomes 2 um. Dry etching based on EB (electron beam) lithography and ICP (inductively-coupled plasma) is used as the etching. Photolithography may also be used. Subsequently, the second conductor 105 serving as the earth conductor is formed on the etched surface by a lift-off method. A 0.1 μm silicon nitride film is formed on the entire surface as a sidewall protective film of the RTDs 101*a* and 101*b*.

Furthermore, embedding based on BCB corresponding to the dielectric 104 is performed by using a spin coat method and the dry etching, and the upper conductor 102 of Ti/Pd/Au, an upper conductor layer of the line 103, and an upper electrode layer of the MIM capacitance 109 are formed by the lift-off method. Finally, a Bi pattern is formed at a part corresponding to the resistance 110 by the lift-off method to connect an electrode at an upper part of the second conductor 105 and the capacitance 109, and the wiring 111 and the power source 112 are connected to each other by the wire bonding or the like, so that the oscillator 100 can be formed. Electric power supply to the oscillator 100 is performed from the bias circuit 120, and when the bias voltage corresponding to the differential negative resistance area is applied to supply a bias current, this operates as the oscillator.

The oscillator 100 according to the present embodiment suppresses the occurrence of the parasitic oscillation caused by the wiring structure corresponding to the problem in the micro strip type oscillator including the patch antenna and the like. Specifically, in the oscillator including the antenna 108 provided with two or more negative resistance elements, a configuration is adopted in which the positive phase is selectively destabilized, and the mutual injection locking in the reversed phase mode is stabilized. When the above-described configuration is adopted, the LC resonance caused by the capacitance of the antenna 108 and the inductance of the bias feeding line is reduced.

With this configuration, according to the oscillator 100 of the present embodiment, it is possible to reduce or suppress the parasitic oscillation at a relatively high frequency in a frequency domain higher than DC and lower than $f_{THz}$. As a result, the terahertz wave at the oscillation frequency $f_{THz}$ of the oscillator 100 can be more stably obtained.

When the terahertz wave at the oscillation frequency $f_{THz}$ can be stably obtained, the terahertz wave at the desired oscillation frequency $f_{THz}$ in the micro strip type oscillator can be obtained at an even higher output. Specifically, since the frequency oscillation or the multi oscillation can be suppressed, it becomes possible to increase the oscillation output by an order of magnitude or higher at the desired oscillation frequency $f_{THz}$.

Example 2

An oscillator 200 according to the present example will be described with reference to FIGS. 6A and 6B. FIG. 6A is a perspective view for describing a configuration of the oscillator 200, and FIG. 6B is a VIB-VIB cross sectional view thereof.

It should be noted that the same configuration as the embodiment and Example 1 is assigned with the same reference symbol in FIGS. 6A and 6B, and detailed descriptions will be omitted.

The oscillator 200 an oscillation element that oscillates the oscillation frequency $f_{THz}$=0.42 THz. According to the present example too, the negative resistance elements 101a and 101b use the resonant tunneling diodes (RTD) in the same manner as Example 1 and will be herein described as the first RTD 101a and the second RTD 101b. The oscillator 200 is an oscillation element of the terahertz wave provided with an antenna (resonance unit) 208 having a configuration in which the AC coupling between the first antenna unit 108a and the second antenna unit 108b is realized by a coupling part 207.

The first antenna unit 108a is a patch antenna and has a structure in which the dielectric 104 and the first RTD 101a are sandwiched by the first conductor layer 102a and the second conductor 105 corresponding to the earth conductor. The second antenna unit 108b is a patch antenna and has a structure in which the dielectric 104 and the second RTD 101b are sandwiched by the second conductor layer 102b and the second conductor 105 corresponding to the earth conductor.

The first antenna unit 108a is a rectangular patch antenna in which the first conductor layer 102a is 200 μm×98 μm, and the first RTD 101a is embedded at a position at 20 μm in the resonance direction from an end of a long side of the first conductor layer 102a (that is, a radiation end). The second antenna unit 108b is a rectangular patch antenna in which the second conductor layer 102b is 200 μm×98 μm, and the second RTD 101b is embedded at a position at 20 μm in the resonance direction from an end of a long side of the second conductor 102b (that is, a radiation end).

The second antenna unit 108b has a mirror symmetrical structure where the inversion occurs while the coupling part 207 is set as an axis. The coupling part 207 is arranged at a position including the center line and is arranged such that the central position of the coupling part 207 is matched with the center line. That is, the second antenna unit 108b has a mirror symmetrical structure in which the first antenna unit 108a is inverted with respect to the center line passing through the gravity center of the antenna 208. Therefore, the first RTD 101a is arranged at a position shifted from the gravity center of the antenna 208 in the resonance direction by 80 μm.

In addition, the second RTD 101b is arranged at a position shifted from the gravity center of the antenna 208 in the resonance direction by −80 μm.

A 4 μm gap exists between the first conductor layer 102a of the first antenna unit 108a and the second conductor layer 102b of the second antenna unit 108b, and no direct connection is not electrically established in the DC. Similarly as in Example 1, 3 μm thick BCB (benzocyclobutene, manufactured by Dow Chemical Company, $\varepsilon_r$=2.4) is arranged as the dielectric 104.

The AC coupling between the first antenna unit 108a and the second antenna unit 108b is realized by the coupling part 207. Specifically, the first conductor (upper conductor) 102 of the antenna 208 includes the first conductor layer 102a, the second conductor layer 102b, and a connection part that connects the first conductor layer 102a to the second conductor layer 102b. According to the present example, the connection part is the coupling part 207.

The coupling part 207 includes an upper electrode 218 including Ti/Au=5/100 nm and a dielectric layer 217 including a 100 nm silicon nitride film. The dielectric layer 217 and the upper electrode 218 are arranged on the first conductor layer 102a and the second conductor layer 102b. The coupling part 207 has a capacitance structure in which the dielectric layer 217 is sandwiched by the upper electrode 218 and the first conductor layer 102a and the second conductor layer 102b, and the first antenna unit 108a is coupled to the second antenna unit 108b by the AC coupling corresponding to the strong coupling to constitute the antenna 208.

In addition, the oscillator 200 according to the present example is configured to satisfy Expression (1). The two locking modes of the positive phase and the reversed phase also similarly exist in the oscillator 200. When the reactance of the first RTD 101a and the reactance of the second RTD 101b are taken into account, the oscillation frequency (resonance frequency) $f_{THz}$ of the oscillator 200 in a case where the mutual injection locking is performed in the reversed phase becomes approximately 0.42 THz.

It should be noted that, when the configuration satisfying Expression (1) is adopted in the case of the structure according to the present example too, the positive phase is destabilized by the mesa diameter and the arrangement of the RTD, and the oscillation occurs in the reversed phase mode, that is, the mutual injection locking can be performed in the reversed phase.

The first conductor layer 102a is connected to a micro strip line corresponding to a first line 203a, and the second conductor 102b is connected to a micro strip line corresponding to a second line 203b. With this configuration, the first antenna unit 108a and the second antenna unit 108b are connected to the bias circuit 220. The first line 203a and the second line 203b have a width of approximately 6 μm and a length of approximately 100 μm, and a gap between the first line 203a and the second line 203b is 4 μm. Other than that, the configuration of the bias circuit 220 is the same as Example 1.

According to the oscillator 200 of the present example, when the locking in the reversed phase is stabilized in the oscillation element including the antenna in which the plurality of negative resistance elements are arranged, the negative resistance elements, it is possible to reduce the parasitic oscillation at the relatively high frequency generated by the feeding structure. As a result, the terahertz wave at the desired oscillation frequency $f_{THz}$ of the oscillator 200 can be more stably obtained. Since the terahertz wave at the oscillation frequency $f_{THz}$ is stably obtained, it is possible to increase the oscillation output of the terahertz wave at the desired oscillation frequency $f_{THz}$ in the micro strip type oscillator.

Example 3

An oscillator 300 according to the present example will be described with reference to FIGS. 7A and 7B and FIG. 8.

Figure 7A:
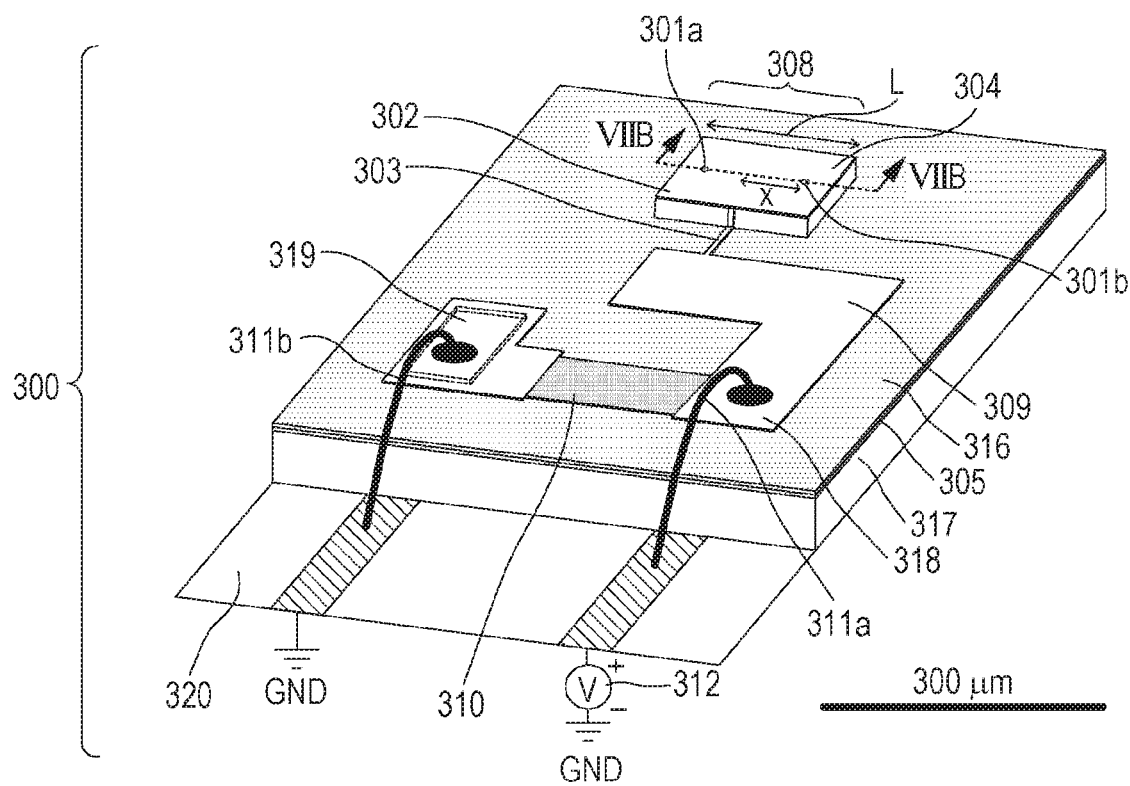
FIGS. 7A and 7B are explanatory diagrams for describing a configuration of the element according to Example 3.
Figure 7B:
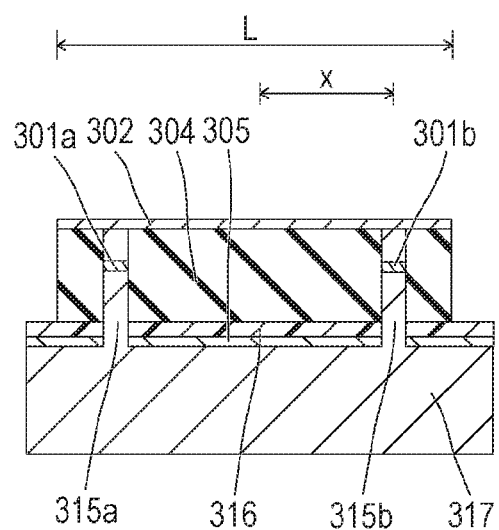

FIG. 7A is a perspective view for describing a configuration of the oscillator 300, and FIG. 7B is a VIIB-VIIB cross sectional view thereof. FIG. 8 is an explanatory diagram for describing characteristics of the oscillator 300. The oscillator 300 proposes a more specific configuration needed to realize the terahertz wave light source using the oscillator 100 described according to the embodiment and Example 1. Detail descriptions of the same configuration and structure as the above-described respective embodiments and respective examples will be omitted.

The oscillator 300 is a semiconductor device in which a semiconductor oscillation element that oscillates the oscillation frequency $f_{THz}$=0.5 THz is integrated. According to the present example too, the resonant tunneling diodes (RTD) is used as the negative resistance element similarly as in Example 1. Hereinafter, the two negative resistance elements will be described as a first RTD 301a and a second RTD 301b.

The first RTD 301a and the second RTD 301b used in the present example are constituted by the RTD of the double barrier structure composed of an InGaAs/AlAs film or the like formed on the InP substrate. A configuration substantially the same as the double barrier RTD disclosed in NPL 3 is used as a configuration of a semiconductor hetero structure of the first RTD 301a and the second RTDRTD 301b. With regard to current-voltage characteristics of the first RTD 301a and the second RTD 301b, the peak current density is 9 mA/um$^2$, and a differential negative conductance per unit area is 26 mS/um$^2$ by measured values. The diameter of the mesa structure of the first RTD 301a and the second RTD 301b according to the present example is 1 μm, and the magnitude of the differential negative resistance is approximately −50Ω per diode.

An antenna 308 includes a patch conductor 302 arranged on an upper side (front surface side) of the InP substrate 317, an earth conductor 305 arranged on a substrate side and also grounded, the dielectric arranged between the patch conductor 302 and the earth conductor 305, the first RTD 301a, and the second RTD 301b. An Au thin film (300 nm thick) having a low resistivity is used as the patch conductor 302 and the earth conductor 305. The antenna 308 is a square patch antenna in which one side of the patch conductor 302 is 170 um, and a resonator length (L) of the antenna becomes L=170 um.

The dielectric 304 formed of 5.5 μm-thick BCB (benzocyclobutene, manufactured by Dow Chemical Company, $\varepsilon_r$=2.4) and a 0.5 μm-thick silicon nitride layer 316 ($\varepsilon_r$=7) are arranged as the dielectric between the patch conductor 302 and the earth conductor 305. The patch conductor 302 is connected to an anode side of the first RTD 301a and the second RTD 301b.

In addition, cathode sides of the first RTD 301a and the second RTD 301b are connected to the earth conductor 305 via posts 315a and 315b formed of InP (indium phosphide) respectively doped into the n type.

The first RTD 301a and the second RTD 301b are arranged at positions respectively shifted from the center of the patch conductor 302 in the resonance direction by distances x and −x. Each of the positions of the first RTD 301a and the second RTD 301b is represented by offset=100*X/L. An input impedance when the high frequency is fed from the RTD to the patch antenna is determined. The first RTD 301a and the second RTD 301b are arranged at axisymmetric positions while a straight line (center line) passing through the center of the patch conductor 302 and also being perpendicular to the resonance direction and the lamination direction is set as an axis.

The patch conductor 302 is connected to an MIM capacitance structure 309 (MIM: Metal Insulator Metal) via a micro strip line 303. The micro strip line 303 has a structure in which the dielectric including the silicon nitride layer 316 is sandwiched by a conductor 303 connected to the patch conductor 302 and the earth conductor 305. With regard to the micro strip line 303, the width (length in the resonance direction) is set as approximately 6 um, and the length in the perpendicular direction which is perpendicular to the resonance direction and the lamination direction is set as approximately 85 μm.

In addition, the MIM capacitance structure 309 is a structure where the dielectric including the silicon nitride layer 316 is sandwiched by a conductor 318 and the earth conductor 305 and corresponds to a configuration in which a capacitance higher than or equal to 20 pF is secured. An Au thin film (1000 nm thick) having a low resistivity is used as the micro strip line 303 and the conductor 318 of the MIM capacitance structure 309.

The MIM capacitance structure 309 is connected to a cathode electrode 319 via a shunt resistance 310 formed of a bismuth thin film. In order that the shunt resistance takes a value lower than an absolute value of a combined negative resistance of the first RTD 301a and the second RTD 301b, a resistance structure of the bismuth thin film (200 um×100 um×0.5 um thick) at which the shunt resistance takes approximately 15Ω is integrated on a substrate 317. The cathode electrode 319 is connected to the earth conductor 305 and has the same potential as the earth conductor.

The substrate 317 has been subjected to die bonding on a power source substrate 320. An Au thin film (1000 nm thick) having a low resistivity is used as a conductor of the cathode electrode 319. The cathode electrode 319 is connected to earth of a power source 312 by a wiring 311b including the wire bonding.

In addition, the MIM capacitance structure 309 also serves as an anode electrode to which the conductor 318 and the power source 312 are connected via a wiring 311a including the wire bonding. Bias voltages and bias currents of the first RTD 301a and the second RTD 301b are adjusted by the power source 312 to obtain desired oscillation characteristics.

Figure 8:
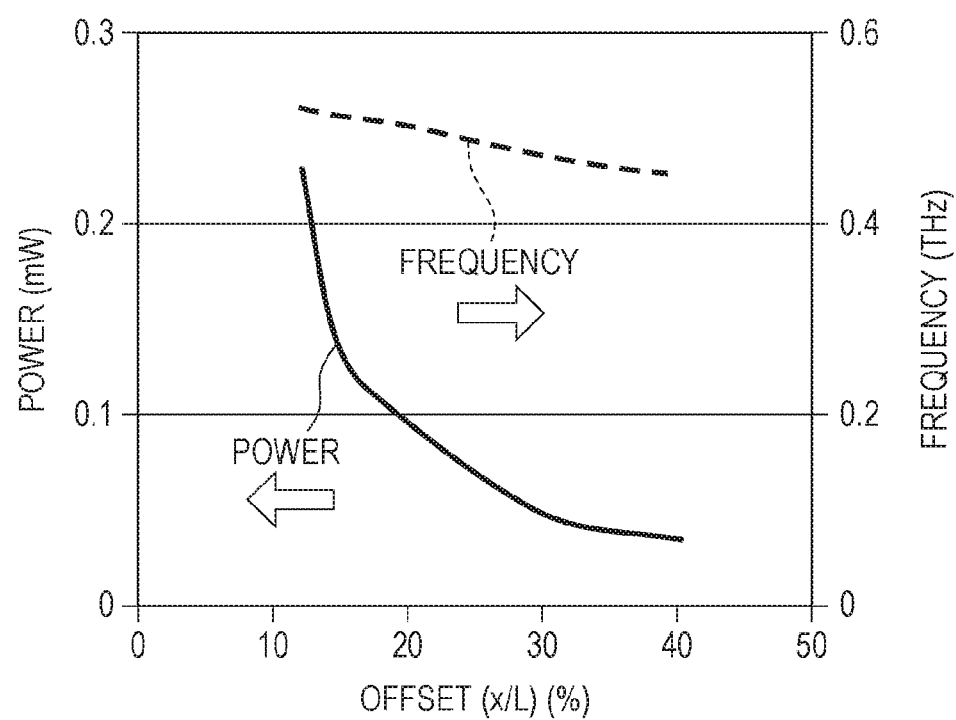
FIG. 8 is an explanatory diagram for describing characteristics of the element according to Example 3.

FIG. 8 illustrates offset dependency analysis results of an oscillation frequency and oscillation power of the oscillator 300 in which the mesa diameter of the first RTD 301a and the second RTD 301b is 1 um. Although the resonance frequency of the patch antenna alone according to the present example is approximately 0.5 THz, as described above, the oscillation frequency in the locking mode in the reversed phase becomes approximately 0.4 to 0.5 THz due to the reactances of the first RTD 301*a* and the second RTD 301*b*.

In addition, the oscillation frequency in the locking mode in the positive phase (resonance based on the inductance of the micro strip line 303 and the capacitance of the antenna 308) hardly has the offset dependency and is estimated at approximately 0.1 THz (not illustrated).

Herein, an analysis method disclosed in NPL 4 is used for the analysis of the oscillation output, and the frequency and the power are calculated from the admittances of the antenna and the RTD in the oscillation condition for the reversed phase (odd mode) illustrated in Expressions (6) and (7).

From FIG. 8, in the case of the structure according to the present example, the mode-locking oscillation is obtained in the reversed phase by adjusting offset to be between 12% or higher and 40% or lower, and it is possible to arbitrarily adjust the oscillation frequency to be between 0.4 THz or higher and 0.5 THz or lower and the oscillation power to be between 0 mW or higher and 0.2 mW or lower.

It should be noted that, in the case of the configuration of the present example, since the positive phase is destabilized in the structure of offset=12% or higher when the mesa diameter of the first RTD 301*a* and the second RTD 301*b* is 1.5 μm or lower, the characteristics illustrated in FIG. 8 are obtained.

On the other hand, since the positive phase mode is stabilized in a case where the diameters of the respective mesas of the first RTD 301*a* and the second RTD 302*b* are set be higher than or equal to 2 μm, the power reduction (<0.01 mW) because of the frequency oscillation (0.1 THz), the multimode oscillation, and the reduction in the radiation efficiency occurs. In this manner, according to the oscillator of the present example, the terahertz wave at the oscillation frequency $f_{THz}$ can be obtained more stably as compared with the related art. With this configuration, the terahertz wave at the desired oscillation frequency $f_{THZ}$ in the micro strip type oscillator can be obtained at an even higher output. Specifically, since the frequency oscillation or the multi oscillation can be reduced, it becomes possible to increase the oscillation output by an order of magnitude or higher at the desired oscillation frequency $f_{THz}$.

In the above, the preferable embodiments of the present invention have been described, but the present invention are not limited to these embodiments, and various modifications and alterations can be made within a scope of the gist.

For example, according to the above-described respective examples, as the first RTD 101*a* and the second RTD 101*b*, the resonant tunneling diodes including n-InP/n-InGaAs and InGaAs/InAlAs grown on the InP substrate have been described. However, the resonant tunneling diodes are not limited to these structures and material systems, and the oscillation element according to the present invention can be provided even in other combinations of structures and materials. For example, a resonant tunneling diode having a double barrier quantum well structure may also be used, or a resonant tunneling diode having a triple or more multiple barrier quantum well may also be used.

In addition, the following respective combinations may be used as the material.

GaAs/AlGaAs/and GaAs/AlAs, and InGaAs/GaAs/AlAs formed on a GaAs substrate
InGaAs/AlGaAsSb formed on an InP substrate
InAs/AlAsSb and InAs/Al formed on an InAs substrate Sb
SiGe/SiGe formed on an Si substrate The above-described structure and material may be appropriately selected in accordance with a desired frequency or the like.

In addition, the above-described embodiment and examples have been described while a case where carriers are electrons is supposed but are not limited to this, and the embodiment and examples may also use positive holes (holes).

In addition, a material for the substrate or the dielectric may be selected in accordance with usage, and a semiconductor such as silicon, gallium arsenide, indium arsenide, or gallium phosphorus, glass, ceramics, Teflon (registered trademark), or resin such as lyethylene terephthalate can be used.

Furthermore, according to the above-described embodiment and examples, a square patch is used as the oscillator of the terahertz wave, but a shape of the oscillator is not limited to this, and for example, an oscillator or the like having a structure using a patch conductor of a polygonal shape such as a rectangle or a triangle, a circular shape, an elliptical shape, or the like may also be used.

In addition, the number of the differential negative resistance elements integrated in the oscillator is not limited to 1, and the oscillator including a plurality of the differential negative resistance elements may be used. The number of lines is not also limited to 1, and a configuration in which a plurality of lines are provided may also be adopted.

The oscillation element described in the above-described embodiment and examples can also be used as a detection element that detects the terahertz wave. For example, the element 100 can also be operated as a detector for the terahertz wave by using an area where a current non-linearity accompanied by voltage changes in the current-voltage characteristics of the RTDs 101*a* and 101*b* occurs.

In addition, an oscillation or a detection of the terahertz wave can also be performed by using the oscillation element described in the above-described embodiment and examples.

According to the element as one aspect of the present invention, it is possible to reduce the parasitic oscillation in the high frequency band as compared with the related art.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An element used for an oscillation or a detection of a terahertz wave, the element comprising:
    a resonance unit including a first conductor, a second conductor, a dielectric arranged between the first conductor and the second conductor, and a first negative resistance element and a second negative resistance element mutually connected in parallel between the first conductor and the second conductor;
    a bias circuit that supplies a bias voltage to each of the first negative resistance element and the second negative resistance element; and
    a line that connects the bias circuit to the resonance unit, wherein the following Expression (1) is satisfied:

$$\mathrm{Re}(Y_{12}) > \tfrac{1}{2}[G - \mathrm{Re}(Y_{11})] \tag{1}$$

where $\mathrm{Re}(Y_{12})$ denotes a real part of a mutual admittance between the first negative resistance element and the second negative resistance element; G denotes a gain of the first negative resistance element or the second negative resistance element; and Re($Y_{11}$) denotes a real part of an admittance of a configuration including the bias circuit, the line, and the resonance unit as viewed from the first negative resistance element, the element being characterized in that
the element is configured in a manner that a mutual injection locking in a positive phase between the first negative resistance element and the second negative resistance element is unstable, and a mutual injection locking in a reversed phase between the first negative resistance element and the second negative resistance element becomes stable.

2. The element according to claim 1, wherein the second negative resistance element is arranged at an axisymmetric position with respect to a position where the first negative resistance element is arranged while a straight line passing through a gravity center of the first conductor and also being perpendicular to a resonance direction of an electromagnetic wave in the resonance unit and a lamination direction of the first conductor and the second conductor is set as an axis in the first conductor.

3. The element according to claim 1, wherein the gain of the first negative resistance element is equal to the gain of the second negative resistance element.

4. The element according claim 1, wherein the line is connected to the resonance unit at the position corresponding to a node of an electric field of the terahertz wave standing in the resonance unit of the element.

5. The element according to claim 1, wherein the resonance unit is a patch antenna.

6. The element according to claim 1, wherein a frequency band of an electromagnetic wave oscillated by the first negative resistance element is overlapped with a frequency band of an electromagnetic wave oscillated by the second negative resistance element.

7. The element according to claim 1, wherein a capacitance having a metal insulator metal (MIM) capacitance structure is provided between the resonance unit and the bias circuit.

8. An element comprising:
a resonance unit including a first antenna unit including a first negative resistance element, a second antenna unit including a second negative resistance element, and a coupling part where a strong coupling between the first antenna unit and the second antenna unit is performed, in which a terahertz wave resonates;
a bias circuit that supplies a bias voltage to the first negative resistance element and the second negative resistance element; and
a line that connects the bias circuit to the antenna,
wherein the following Expression (1) is satisfied $$\text{Re}(Y_{12}) > \frac{1}{2}[G - \text{Re}(Y_{11})] \quad (1)$$

where Re($Y_{12}$) denotes a real part of a mutual admittance between the first negative resistance element and the second negative resistance element;
where G denotes a gain of the first negative resistance element or the second negative resistance element; and
where Re($Y_{11}$) denotes a real part of an admittance of a configuration including the bias circuit, the line, and the resonance unit as viewed from the first negative resistance element.

9. The element according to claim 8, wherein
the first antenna unit includes a first conductor layer, a conductor, a dielectric arranged between the first conductor layer and the conductor, and the first negative resistance element electrically connected between the first conductor layer and the conductor, and
the second antenna unit includes a second conductor layer, the conductor, a dielectric arranged between the second conductor layer and the conductor, and the second negative resistance element electrically connected between the second conductor layer and the conductor.

10. The element according to claim 9, wherein the conductor includes a conductor included in the first antenna unit, a conductor included in the second antenna unit, and a conductor included in the coupling part.

11. The element according to claim 9, wherein the coupling part includes a connection part that connects the first conductor layer to the second conductor layer, the conductor, and the dielectric arranged between the connection part and the conductor.

12. The element according to claim 11, wherein the first conductor layer, the second conductor layer, and the connection part are formed of a single conductor.

13. The element according to claim 8, wherein the coupling part is arranged at a position corresponding to a node of an electric field of the terahertz wave standing in the resonance unit.

14. The element according to claim 8, wherein the coupling part performs a DC coupling between the first antenna unit and the second antenna unit.

15. The element according to claim 8, wherein the first antenna unit and the second antenna unit are mirror symmetrical while the coupling part is set as an axis.

16. The element according to claim 8, wherein the gain of the first negative resistance element is equal to the gain of the second negative resistance element.

17. The element according claim 8, wherein the line is connected to the resonance unit at the position corresponding to a node of an electric field of the terahertz wave standing in the resonance unit of the element.

18. The element according to claim 8, wherein the resonance unit is a patch antenna.

19. The element according to claim 8, wherein a frequency band of an electromagnetic wave oscillated by the first negative resistance element is overlapped with a frequency band of an electromagnetic wave oscillated by the second negative resistance element.

20. The element according to claim 8, wherein a capacitance having a metal insulator metal (MIM) capacitance structure is provided between the resonance unit and the bias circuit.

21. An element comprising:
a resonance unit including a first antenna unit including a first negative resistance element and a first conductor layer, a second antenna unit including a second negative resistance element and a second conductor layer, and a coupling part where a strong coupling between the first antenna unit and the second antenna unit is performed, in which a terahertz wave resonates;
a bias circuit that supplies a bias voltage to the first negative resistance element and the second negative resistance element; and
a line that includes an electrode and a second dielectric and connects the bias circuit to the resonance unit, the second dielectric being arranged between the electrode and the first conductor layer;
wherein the first negative resistance element and the second negative resistance element are mirror symmetrical with respect to an axis, and wherein the coupling part is arranged at a position including the axis.

22. The element according to claim 21,
wherein the coupling part includes a connection part that connects the first conductor layer to the second conductor layer, and
wherein the first conductor layer, the second conductor layer, and the connection part are formed of a single conductor.

23. The element according to claim 21, wherein the coupling part performs a DC coupling between the first antenna unit and the second antenna unit.

24. The element according to claim 21, wherein the first negative resistance element and the second negative resistance element are arranged at positions of 80 μm from the axis.

25. The element according to claim 21, wherein the first conductor layer contains at least one selected from the group consisting of Ti, Pd, and Au.

26. The element according to claim 21, wherein the first negative resistance element and the second negative resistance element are resonant tunneling diodes comprised of mesa.

27. The element according to claim 26, wherein a diameter of the mesa is 3 μm or less.

28. The element according to claim 26, wherein a diameter of the mesa is 2.5 μm or less.

29. The element according to claim 21, wherein the first negative resistance element and the second negative resistance element contain at least one selected from the group consisting of InP, InGaAs, InAlAs, GaAs, AlGaAs, AlAs, AlGaAsSb, InAs, AlAsSb, AlSb, and SiGe.

30. The element according to claim 21, wherein a width of the line is 6 μm.

31. The element according to claim 21, wherein a capacitance having a metal insulator metal (MIM) capacitance structure is provided between the resonance unit and the bias circuit.

32. The element according to claim 21, wherein the resonance unit is a patch antenna.

* * * * *